United States Patent [19]

Lee et al.

[11] Patent Number: 5,128,738
[45] Date of Patent: Jul. 7, 1992

[54] INTEGRATED CIRCUIT

[75] Inventors: Kuo-Hua Lee, Lower Macungie Township, Lehigh County; William J. Nagy, Bethlehem; Janmye Sung, Lower Macungie Township, Lehigh County, all of Pa.

[73] Assignee: AT&T Bell Laboratories, Murray Hill, N.J.

[21] Appl. No.: 701,270

[22] Filed: May 16, 1991

[51] Int. Cl.⁵ .................. H01L 29/04; H01L 23/48; H01L 27/02
[52] U.S. Cl. ........................ 357/41; 357/71; 357/51; 357/59
[58] Field of Search .............. 357/59 F, 59 G, 71 P, 357/51, 59 J, 59 K, 41

[56] References Cited

U.S. PATENT DOCUMENTS 4,792,841 12/1988 Nagasawa et al .................. 357/71

FOREIGN PATENT DOCUMENTS 231851 12/1984 Japan ................................ 357/23.6

OTHER PUBLICATIONS

IEEE Journal of Solid-State Circuits, vol. 23, No. 5, Oct. 1988, pp. 1054–1059, "A 7.5-ns 32Kx8 CMOS SRAM," Hiroaki Okuyama et al.

Primary Examiner—William D. Larkins
Assistant Examiner—Robert Limanek
Attorney, Agent, or Firm—John T. Rebberg

[57] ABSTRACT

A semiconductor memory cell with parallel gates is disclosed. The direction of the gates is desirably chosen to minimize lithographic astigmatic effects. Thus gates of comparatively uniform width are produced and predictability of transistor performance thereby improved. Another embodiment of the invention features a connetion between two conductive layers and a source/drain. The connection forms a node between one access transistor and one pull-down transistor.

4 Claims, 3 Drawing Sheets

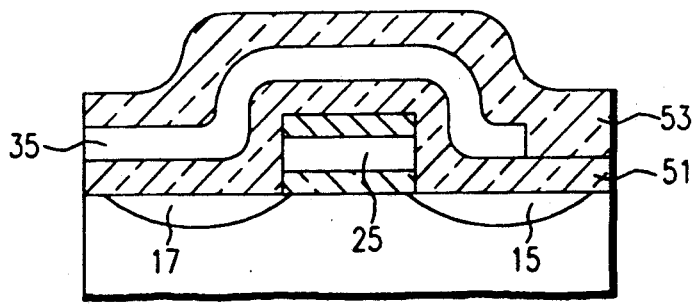
FIG. 6
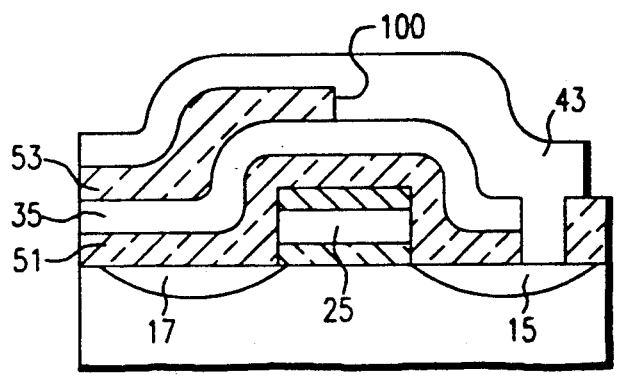
FIG. 7
FIG. 3
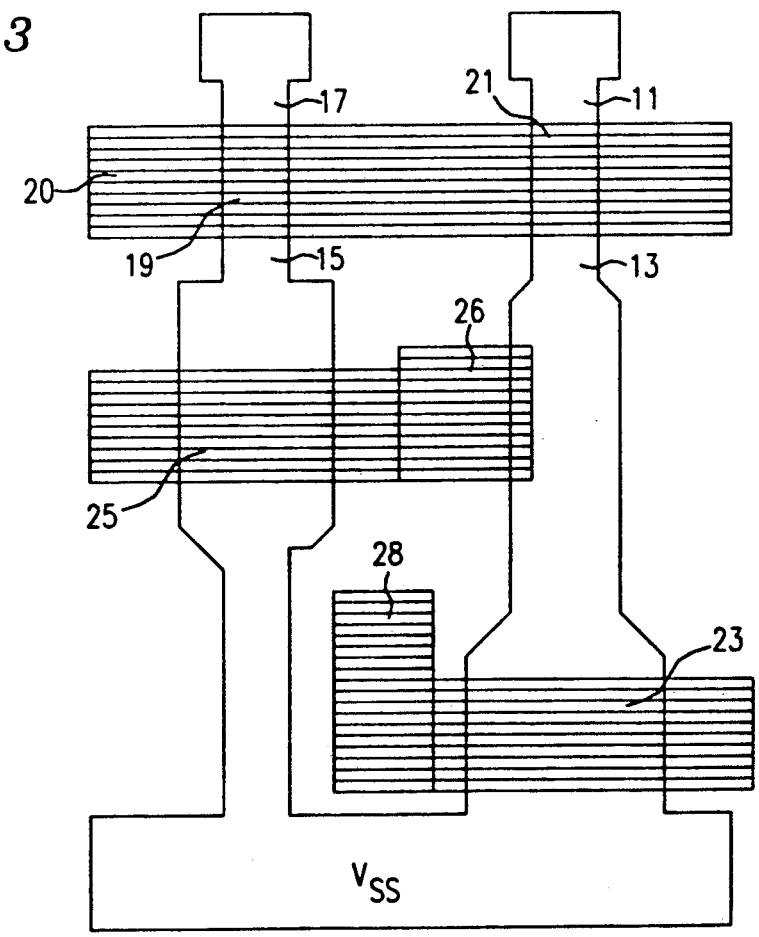

INTEGRATED CIRCUIT

TECHNICAL FIELD

This invention relates to semiconductor integrated circuits and methods for their manufacture.

BACKGROUND OF THE INVENTION

Static semiconductor memories are often referred to as SRAMs ("static random access memory") because (unlike DRAMs or dynamic random access memories) they do not require periodic refresh signals to retain their stored data. The bit state in an SRAM is stored in a pair of cross-coupled inverters which form a circuit termed a "flip-flop." The voltage on each of the two outputs of a flip-flop circuit is stable at only one of two possible voltage levels because the operation of the circuit forces one output to a high potential and the other to a low potential. Flip-flops maintain a given state for as long as the circuit receives power, but they can be made to undergo a change in state (i.e., to flip) upon the application of a trigger voltage of sufficient magnitude and duration to the appropriate input.

As SRAMs have evolved, they have undergone an increase in density. Most of the increase in density has been due to the use of smaller linewidths. As linewidths have begun to shrink below one micron, artisans have noticed that problems with stepper lens astigmatism make it extremely difficult, if not impossible, to maintain constant linewidths over a printing field. Frequently practitioners have noticed that lines in one particular direction exhibit greater dimensional consistency than lines in other directions.

Typical SRAM cells utilize gates formed by the above-mentioned lithographic processes. The above-mentioned variation in linewidth affects gate size, and thus device performance, and ultimately cell performance.

Another problem confronted by circuit designers is the manner in which one of the access transistors is connected to the appropriate pull-down transistor. The connection often requires a nitride overlayer on the gate and additional processing steps.

SUMMARY OF THE INVENTION

The present invention helps to alleviate the problems caused by stepper astigmatism by providing an integrated circuit with a plurality of transistors in which each gate extends over an active region and all of the gates are parallel to one another. The term "thinox" region is also used to refer to the transistor active region (which contains the source and drain). In many conventional transistor manufacturing processes the thinox regions are defined between field oxides or trenches.

Thus, one illustrative embodiment of the present invention includes an integrated circuit with at least one static random access memory cell with a plurality of transistors, each transistor having a gate extending over a thinox region, and all of the gates being parallel to each other over the thinox region.

The invention also comprehends, in an alternative embodiment, a method for fabricating a semiconductor integrated circuit which includes: evaluating a lithographic tool to determine an astigmatically preferred direction for lines of critical width and then fabricating the integrated circuit so that the lines of critical width are parallel and extend in the astigmatically preferred direction.

For example. "lines of critical width" are often gates which include an oxide with an overlayer of polysilicon and perhaps silicide.

Another embodiment of the invention includes an interconnection between an access transistor and a pull-down transistor. Illustratively, the embodiment includes:

a gate structure;
a source of drain proximate the gate;
a first dielectric covering the gate;
a first material layer covering the first dielectric;
a second dielectric at least partially covering the first material layer;
the first and second dielectrics have first and second openings respectively which together expose the source or drain region; and
a second material layer partially covering the second dielectric and contacting the source or drain region and the first material layer.

Illustratively, both the first and second material layers are polysilicon. The first layer contacts the gate of one pull-down transistor and shields the gate of the other pull-down transistor during subsequent etching. The second layer, among other functions, contacts the first layer and the drain of one access transistor, thus forming a node, e.g., reference numeral 15 in FIG. 1.

BRIEF DESCRIPTION OF THE DRAWINGS

FIGS. 2-5 are diagrams depicting the layout of an illustrative embodiment of the inventive device;

FIGS. 6-7 are cross-sectional views of a portion of the device diagramed in FIG. 5.

DETAILED DESCRIPTION

Figure 1:
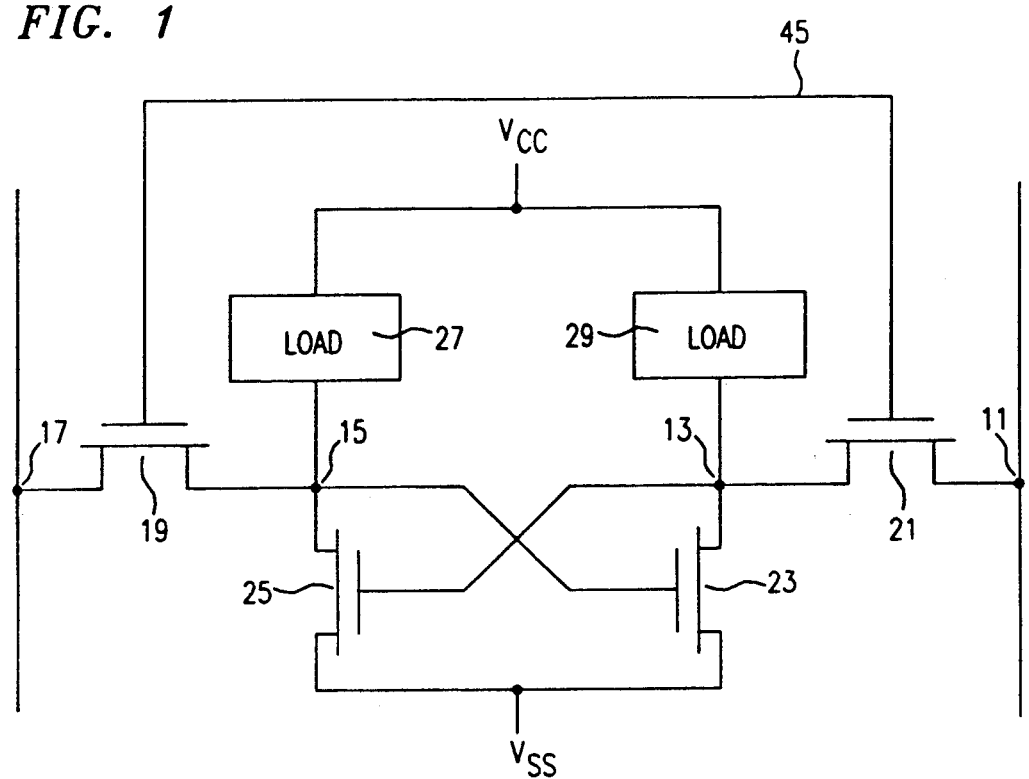
FIG. 1 is a circuit depicting a typical SRAM cell.

FIG. 1 is a circuit diagram indicating a typical SRAM cell. The operation of the SRAM cell depicted in FIG. 1 essentially involves two inverters and behaves as a flip-flop. Transistors having gates 19 and 21 serve as access transistors. For example, when transistor 19 is turned on, a logic one appearing at node 17 is transmitted to node 15. Node 15 is connected to the gate of pull-down transistor 23. The pull-down transistor 23 begins to conduct, causing a logic low to appear at node 13. The low condition at node 13 turns off the pull-down transistor 25. Consequently, a logic one is observed at node 15 through load 27. Thus, interlocked transistors 23 and 25 serve as a latch circuit. Once a logic low (0) or logic high (1) is entered at node 15 or node 13 it remains dynamically amplified by the circuit.

While there are many implementations of the circuit shown in FIG. 1, applicants desire to implement FIG. 1 circuit in a cell which has a small size and yet exhibits high performance.

As mentioned before, designers confronted with the problem of laying out SRAM cells are frequently forces to have the gates of the access and the pull-down transistors extending in various directions. However, it has been found that astigmatism in the lithographic steppers commonly used for semiconductor manufacturing may produce varying gate widths when the gates extend in different directions. Many steppers exhibit an astigmatic field curvature in which the focal plane for a particular feature orientation is flatter and has less optical-axis-to-wafer tilt than other orientations. The present invention contributes to a solution to the astigmatism problem by having all of the device gates extend in one direction (generally chosen as the direction in which astigmatic effects are least objectionable). Methods of measuring and detecting astigmatic field curvature are discussed in U.S. patent application Ser. No. 664,187 entitled "Semiconductor Integrated Circuit Fabrication Utilizing Latent Imaging," assigned to the assignee of the present invention and incorporated herein by reference.

Figure 2:
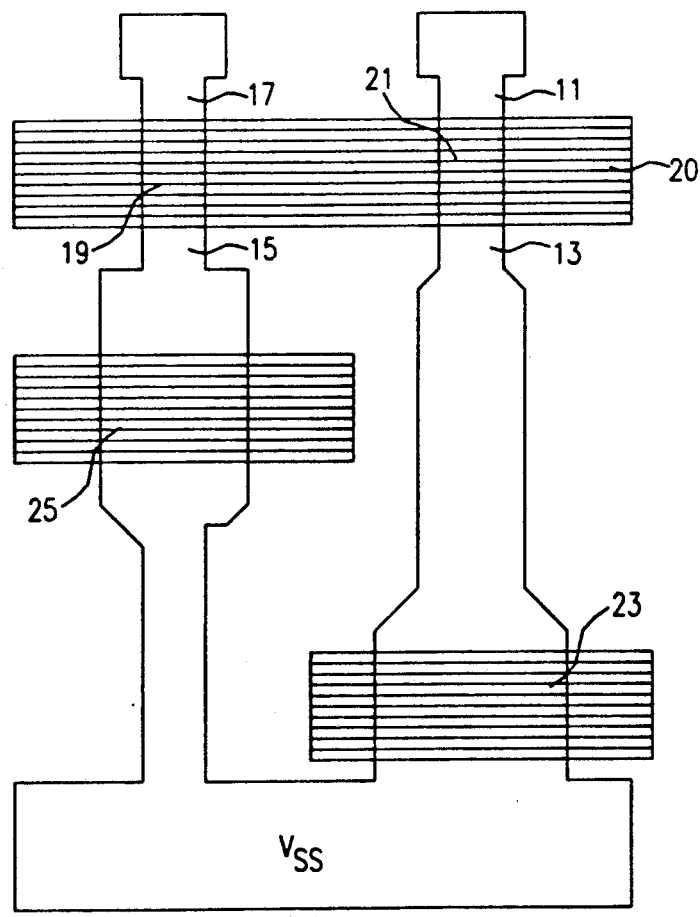

Turning to FIG. 2, there is depicted a diagram illustrating the polysilicon gates and thinox regions (in a top down view) of an illustrative embodiment of the present invention. Beneath each thinox region is an appropriate semiconductor junction. Consequently, for simplicity in the discussion which follows, various thinox regions will be associated with nodes in FIG. 1. The gates and thinox regions in FIGS. 2-5 are generally drawn to scale. (those versed in the art will realize that the diagrams of FIGS. 2-5 omit interlevel oxide layers and gate oxides.) Furthermore, enlarged polysilicon landing pads have also been omitted from FIG. 2. It will be noted in reviewing FIG. 2, that polysilicon stripe 20 constitutes both gates 19 and 21 in the circuit diagram of FIG. 1. Nodes 17 and 11 from the circuit diagram of FIG. 1 are indicated as corresponding thinox regions in FIG. 2. Similarly, nodes 15 and 13 of FIG. 1 are indicated in FIG. 2 as corresponding thinox regions. Polysilicon stripe 25 is the gate of the left hand pull-down transistor 25 in FIG. 1. It will be noted that polysilicon stripe 25 is parallel to polysilicon stripe 20. Similarly, polysilicon stripe 23 is FIG. 2 corresponds to the gate 23 of the right hand pull-down transistor in the circuit of FIG. 1. It will be noted that polysilicon stripe 23 is parallel to stripes 25 and 20. Thus, it will be noted that all of the gates are laid out in a parallel manner. It will be noted from both figures that gate 25 is between node 15 and the VSS regions and gate 23 is between node 13 and VSS.

The gates are laid out in whatever direction is astigmatically preferable. The astigmatism of the lens may be evaluated by various techniques including the patterning of test pattern lines and subsequent SEM analyses to determine in which direction the stepper astigmatism is most tolerable. In addition, an evaluation of latent images in photoresist as taught in the aforementioned U.S. patent application Ser. No. 664,187 may be performed. After the preferred direction is determined and the stepper is optimized for features of the chosen orientation, cell layout in accordance with FIG. 2 may be performed.

FIG. 3 is similar to FIG. 2 in that it shows three parallel polysilicon strips 20, 25, and 23. However, FIG. 3 also includes additional polysilicon pads 26 and 28. For simplicity, of course, polysilicon pads 26 and 28 re formed at the same time that polysilicon stripes 20, 25, and 23 are formed. Although pads 26 and 28 are somewhat different in dimension and orientation than polysilicon stripes 20, 25, and 23, their presence and orientation does not affect the performance of the transistors of the SRAM cells. Serifs of various types may be employed in the layout of the polysilicon lines. (For simplicity serifs have been omitted.)

Generally, all of the polysilicon gates in this invention are silicided, although this is not critical to the invention.

Figure 5:
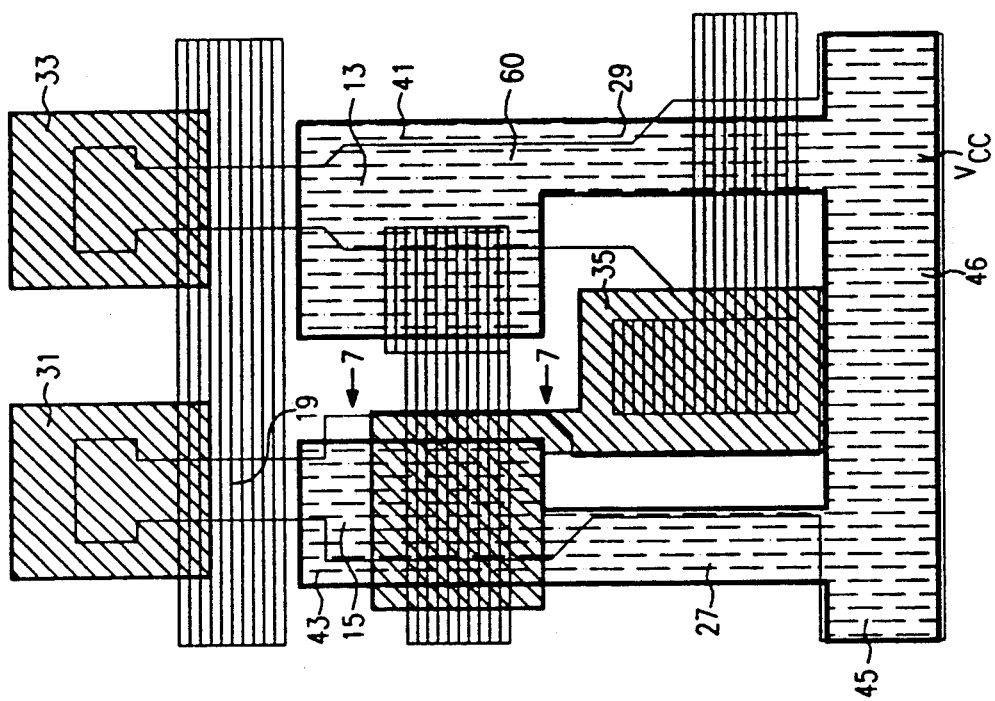
Figure 4:
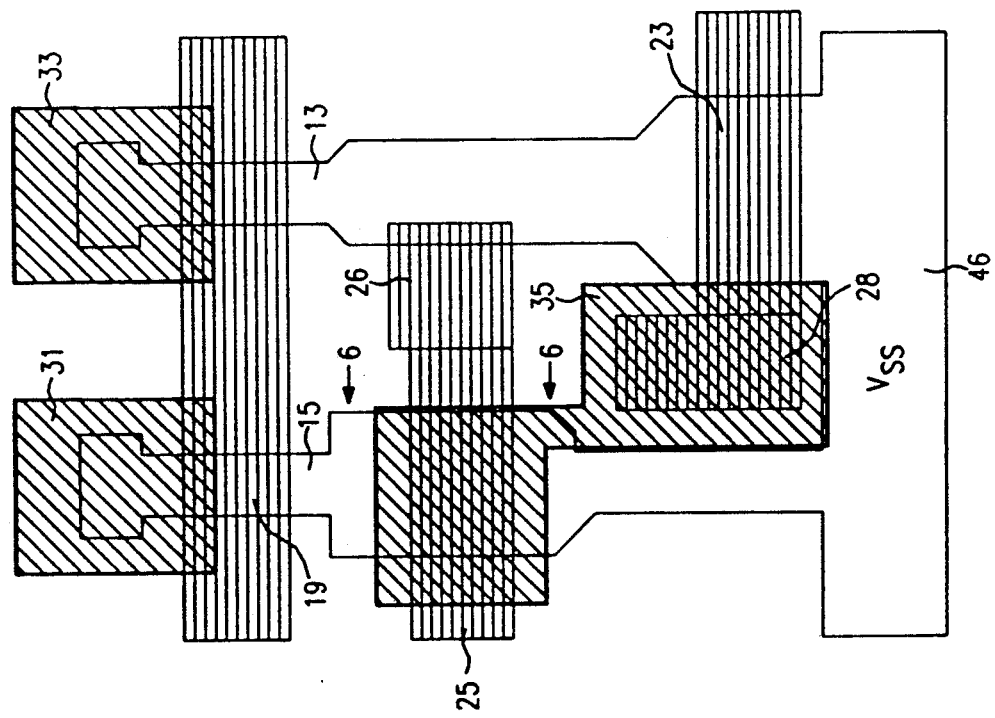

FIGS. 4 and 5 illustrate additional layers of the cell and serve to demonstrate the feasibility of the cell layout with parallel gates. FIG. 4 is another top down view of the cell depicted in FIG. 3 with an additional layer of polysilicon deposited. This layer is conventionally referred to as "poly 2." (It is understood by those skilled in the art that a layer of oxide has been deposited over the gate level poly 1 of FIG. 2 and an appropriate opening made at landing pad 28 in the overlying oxide for contact between the poly 2 layer and landing pad 28. Returning to FIG. 4, patterned polysilicon pads 31, 33, and 35 have been deposited and formed. Polysilicon pads 31 and 33 serve to provide an enlarged landing pad area for subsequent bit line connection. Polysilicon layer 35 connects to polysilicon pad 28 through a window. Polysilicon layer 35 does not make any direct electrical connection to gate 25. As will be subsequently explained, polysilicon layer 35 serves to protect gate 25 from subsequent etching. Polysilicon layer 35 also partially covers thinox region 15. However, because of the presence of an interlevel oxide (e.g., reference numeral 51 in FIG. 6), at this point in the fabrication process, there is no electrical contact between polysilicon layer 35 and thinox region 15. The presence of polysilicon layer 35 means that it is not necessary that gate 25 be covered by a protective material such as nitride.

Because of the presence of protective polysilicon layer 35, it is not necessary that the alignment of a subsequent window to thinox region 15 be particularly critical because a slight misalignment will merely contact polysilicon layer 35 and not damage gate 25. This feature will become clearer in subsequent discussion.

FIG. 6 illustrates in cross-sectional detail how polysilicon layer 35 covers gate 25 and partially covers thinox region 15. It will be noted that oxide layer 51 (which is, of course, not shown in FIGS. 2-5) prevents polysilicon layer 35 from making contact with the junction near thinox region 15. Furthermore, it will be noted that another oxide layer 53 has been deposited over polysilicon layer 35.

Turning to FIG. 5, it is understood by those skilled in the art that after the structure depicted in FIG. 4 has been fabricated, another layer of oxide (e.g., 53 in FIGS. 6-7) is deposited, windows opened where appropriate and, finally, a third layer of polysilicon 60 depicted in FIG. 5 is deposited and patterned. Specifically, two windows are opened, one window over thinox region 13 and the other over thinox region 15. A third layer of polysilicon 60 is deposited and patterned as shown in FIG. 5. Portion 41 of polysilicon layer 60, when deposited over thinox region 13, serves to provide electrical connection via polysilicon pad 26 between polysilicon gate 25 and thinox region 13. Thus, referring to FIG. 1, polysilicon pad 41 provides the cross-connection between the left hand pull-down transistor and node 13.

Portion 43 of polysilicon layer 60 serves to provide electrical contact between node (thinox 15) to which a window 100 has been opened, as will be recalled, and gate 23 via its connection with polysilicon layer 35 and polysilicon pad 28.

The cross-sectional view of FIG. 7 illustrates how polysilicon layer 43 serves to create electrical contact between thinox region 15 and gate 23. FIG. 7 illustrates the structure depicted in FIG. 6 after a window has been opened in oxide layer 53 and polysilicon portion 43 of layer 60 has been deposited therein. It will be noted that the structure depicted in FIG. 7 has several advantages: Polysilicon layer 35 protects gate 25 from etching during the process of opening the window. As will be noted from FIG. 17, the window 100 opened in oxide layer 53 need not be very precisely positioned, i.e., the window dimensions may exceed size of thinox region 15 and may extend over gate 25. However, there is no risk of damage to gate 25 because of protective polysilicon layer 35. Furthermore, it can be seen from FIG. 7 that polysilicon portion 43 contacts polysilicon layer 35 and junction 15. Thus, returning to FIG. 5, it will be noted that polysilicon layer 43 provides the necessary interconnection between gate 23 and node 15 of FIG. 1.

Returning to FIG. 5, it will be also noted that polysilicon portion 45 of polysilicon layer 60 is formed over VSS region 46 to create the VCC line. (Of course, polysilicon portions 41, 43, and 45 are all formed at the same time as part of layer 60. They are merely denominated separately for convenience in discussion.)

Finally, loads 27 and 29 are formed in polysilicon portions 43 and 41, respectively, by selectively doping the pads, leaving an undoped region in the general area of the reference numerals to constitute a resistive load. The doping is accomplished by use of a mask.

Metal bit lines are attached to landing pads in the vicinity of polysilicon landing pads 31 and 33. The landing pads advantageously provide for substantial amount of misalignment for the mask for the bit line.

We claim:

1. A semiconductor integrated circuit comprising:
   a gate structure;
   a source or drain region proximate said gate;
   a first dielectric covering said gate;
   a first material layer covering said first dielectric;
   a second dielectric at least partially covering said first material layer;
   said first and second dielectrics having first and second openings respectively which together expose said source or drain region;
   a second material layer partially covering said second dielectric and contacting said source or drain region and said first material layer
   AND CHARACTERIZED IN THAT said second opening extends over said gate structure.

2. The circuit of claim 1 wherein said first material is polysilicon.

3. The circuit of claim 1 wherein said second material is polysilicon.

4. The circuit of claim 1 wherein said first material at least partially covers said source or drain region.

* * * * *